US005259768A

United States Patent [19]

Brunker et al.

[11] Patent Number: 5,259,768

[45] Date of Patent: Nov. 9, 1993

[54] IMPEDANCE AND INDUCTANCE CONTROL IN ELECTRICAL CONNECTORS AND INCLUDING REDUCED CROSSTALK

[75] Inventors: David L. Brunker, Naperville; Frank A. Harwath, Downers Grove; Dennis K. Scheer, Willowbrook, all of Ill.

[73] Assignee: Molex Incorporated, Lisle, Ill.

[21] Appl. No.: 900,209

[22] Filed: Jun. 17, 1992

Related U.S. Application Data

[63] Continuation-in-part of Ser. No. 856,593, Mar. 24, 1992, abandoned.

[51] Int. Cl.⁵ .............................................. H05K 1/00

[52] U.S. Cl. .............................. 439/60; 439/637; 439/751; 29/874

[58] Field of Search .................... 439/55, 60, 62, 65, 439/630–637, 59, 61, 751; 29/874, 884, 845

[56] References Cited

U.S. PATENT DOCUMENTS

| | | | |
|---|---|---|---|
| 3,196,377 | 7/1965 | Minich | 439/60 |
| 3,470,522 | 9/1969 | Lawrence | 439/55 |
| 3,539,976 | 11/1970 | Reynolds | 339/177 |
| 3,573,704 | 4/1971 | Tarver | 339/14 |
| 4,461,522 | 7/1984 | Bakermans et al. | 439/636 |
| 4,552,420 | 11/1985 | Eigenbrode | 339/14 R |
| 4,707,039 | 11/1987 | Whipple | 439/75 |
| 4,886,474 | 12/1989 | Drago | 439/856 |
| 5,026,292 | 6/1991 | Pickles et al. | 439/108 |
| 5,071,371 | 12/1991 | Harwath et al. | 439/60 |

*Primary Examiner*—David L. Pirlot

*Attorney, Agent, or Firm*—Charles S. Cohen

[57] ABSTRACT

A method and structure of an electrical connector is provided for tuning the impedance of the connector according to a given impedance of an electrical circuit in which the connector is interconnected. The connector includes a dielectric housing having a receptacle for receiving a complementary electrical component. A plurality of terminals are mounted on the housing. The terminals include body portions located in the housing and contact portions for engaging respective contacts on the electrical component. The body portions include mechanically nonfunctional sections of a given area which effect a given capacitance. The mechanically non-functional sections are selectively trimmable to selectively vary the area thereof and thereby vary the capacitance of the terminals and, therefore, the impedance of the connector to match the given impedance of the electrical circuit. The connector includes a plurality of signal terminals and a plurality of ground terminals. The ground terminals have at least two points of contact for engaging a common ground circuit on the printed circuit board for reducing the inductance between a particular ground terminal and its respective circuit trace.

5 Claims, 3 Drawing Sheets

IMPEDANCE AND INDUCTANCE CONTROL IN ELECTRICAL CONNECTORS AND INCLUDING REDUCED CROSSTALK

RELATED APPLICATION

This is a continuation-in-part of co-pending application Ser. No. 07/856,593, filed Mar. 24, 1992, now abandoned, which is assigned to the assignee of this invention.

FIELD OF THE INVENTION

This invention generally relates to the art of electrical connectors and, particularly, to a method and structure for controlling the impedance and the inductance in electrical connectors and for reducing the crosstalk in the connectors.

BACKGROUND OF THE INVENTION

In today's high speed electronic equipment, it is desirable that all components of an interconnection path be optimized for signal transmission characteristics, otherwise the integrity of the system will be impaired or degraded. Such characteristics include risetime degradation or system bandwidth, crosstalk, impedance control and propagation delay. Ideally, an electrical connector would have little or no affect on the interconnection system from these characteristics. In other words, the system would function as if circuitry ran through the interconnection without any affect on the system. However, such an ideal connector is impractical or impossible, and continuous efforts are made to develop electrical connectors which have as little affect on the system as possible.

Impedance and inductance control are concerns in designing an ideal connector. This is particularly true in electrical connectors for high speed electronic equipment, i.e., involving high frequencies. An example of one such connector is called an "edge card" connector. An edge connector is provided for receiving a printed circuit board having a mating edge and a plurality of contact pads adjacent the edge. Such edge connectors have an elongated housing defining an elongated receptacle or slot for receiving the mating edge of the printed circuit board. A plurality of terminals are spaced along one or both sides of the slot for engaging the contact pads adjacent the mating edge of the board. In many applications, such edge connectors are mounted on a second printed circuit board. The mating "edge" board commonly is called the "daughter" board, and the board to which the connector is mounted is called the "mother" board.

This invention is directed to a method and structure for tuning the impedance of an electrical connector, such as an edge connector, so as to provide an interconnection in an electrical circuit having a given impedance and tuning the connector to substantially match that impedance. The invention also is directed to providing terminals for printed circuit board mounted connectors which reduce the inductance of the connectors.

In addition, cross-talk is a concern in designing an ideal connector, particularly in an edge connector as described above. Heretofore, a myriad of attempts have been made to control cross-talk including installing ground planes in the connector, i.e., by providing some form or another of an integrated grounding structure. Most ground plane systems add complexity to the connector, which results in additional expense. This invention is directed to solving these problems by providing a simple, low cost, low cross-talk connector system while simultaneously controlling the impedance of the connector. This is accomplished by providing significantly larger ground terminals than signal terminals, thus optimizing the performance of each, in combination with a particular alternating array of such terminals.

SUMMARY OF THE INVENTION

An object, therefore, of the invention is to provide a method and structure for tuning the impedance of an electrical connector adapted for interconnection in an electrical circuit having a given impedance.

Another object of the invention is to provide improved terminals for reducing the inductance of an electrical connector, particularly a connector mounted to a printed circuit board, thereby extending in-system bandwidth.

A further object of the invention is to provide a system for reducing crosstalk in an electrical connector.

In the exemplary embodiment of the invention, generally, the connector includes a dielectric housing for mounting a plurality of terminals, the housing having a receptacle for receiving a complementary mating connector or electrical component. Specifically, the invention is illustrated herein in an edge connector having a slot for receiving the mating edge of a printed circuit board.

The invention contemplates a method and structure in which the terminals are provided with body portions located in the housing and contact portions located at the receptacle or slot for engaging appropriate terminals of the mating connector or printed circuit board when inserted into the receptacle or slot. The body portions include mechanically "functional" sections for mounting the terminals in the housing. The body portions also include mechanically "non-functional" sections of a given area which effect a given capacitance. The mechanically nonfunctional sections are trimmable to vary the terminal area and thereby vary the capacitance to alter the connector's impedance and to substantially match the given impedance of the electrical circuit.

As contemplated by the invention, the mechanically non-functional sections are provided in the form of stubs which either can be trimmed to a given size and, therefore, a given effective area, or the stubs can be completely broken away from the terminals.

In the illustrated embodiment of the invention, the body portions of the terminals include base portions and the functional sections of the body portions are in the form of mounting tangs located in recesses in the housing for securing the terminals in the housing. The mounting tangs and the contact portions project from the base portions. The mechanically non-functional sections or stubs project from the base portions and the stubs either can be trimmed to a given size or severed from the base portions.

The connector includes both signal terminals and ground terminals mounted on the housing and, in accordance with an aspect of the invention, a plurality of the signal terminals and a plurality of the ground terminals are mounted on opposite sides of the receptacle or slot for engaging contact pads on opposite sides of the printed circuit board. The invention contemplates that the signal terminals and the ground terminals be mounted in an alternating array along each side of the slot, with each signal terminal being aligned with a ground terminal on the opposite side of the slot. The ground terminals have significantly larger transverse areas than the signal terminals. The enlarged ground terminals, in combination with the alternating array of signal and ground terminals lengthwise and transversely of the slot, provides a simple and effective system for reducing crosstalk in the connector. In essence, the ground terminals "shadow" the signal terminals, thereby providing increased electrical isolation of individual signal terminals from all other signal terminals.

Finally, the invention contemplates such an electrical connector as described above wherein the connector is mounted on a printed circuit board having a common ground circuit and a plurality of circuit traces forming portions of the common ground circuit. At least one of the ground terminals has at least two grounding feet for engaging a respective one of the circuit traces of the common ground circuit to establish a multiple-point contact therewith.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
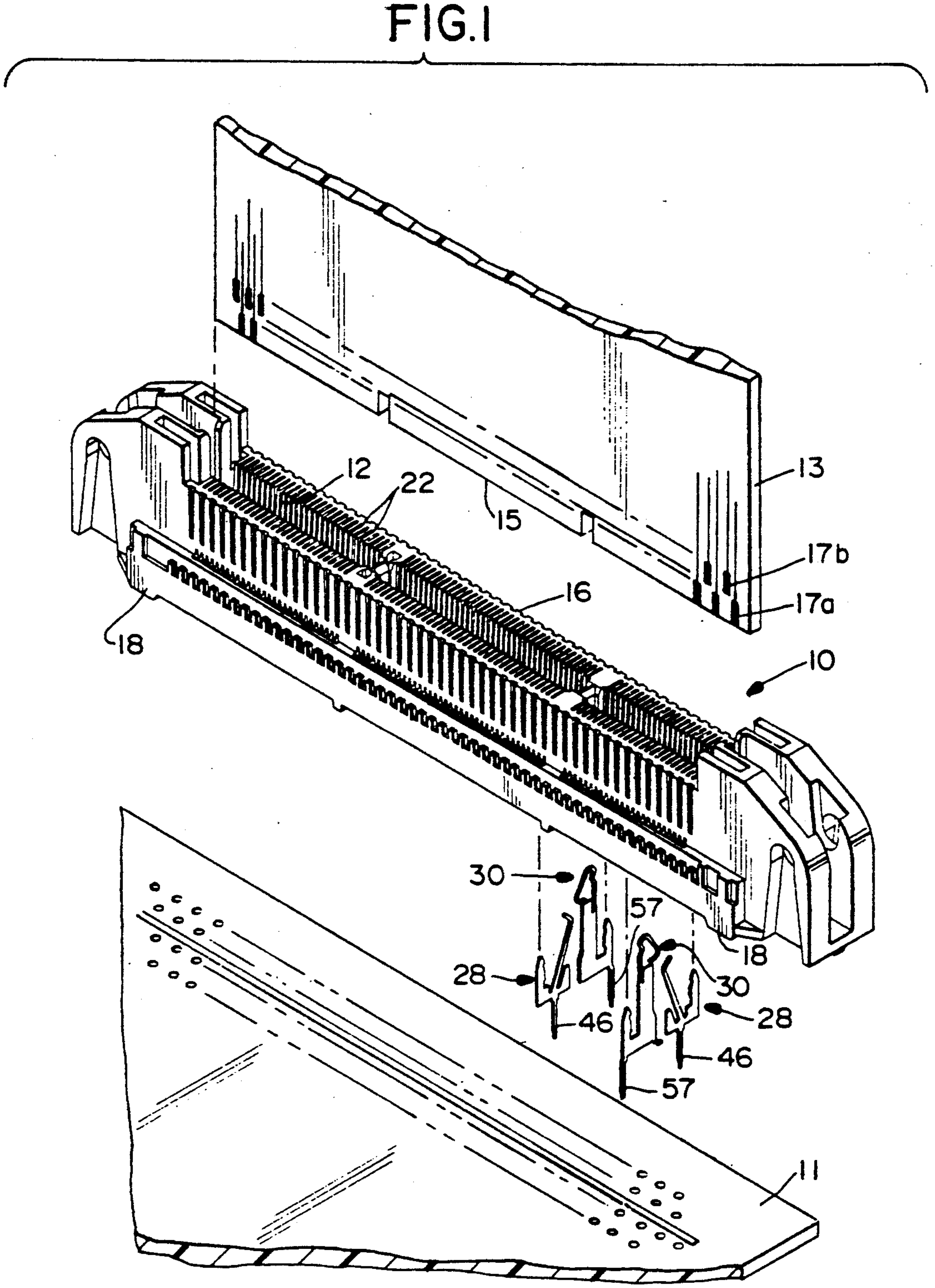
FIG. 1 is a partially exploded perspective view of an edge connector according to the invention.
Figure 3:
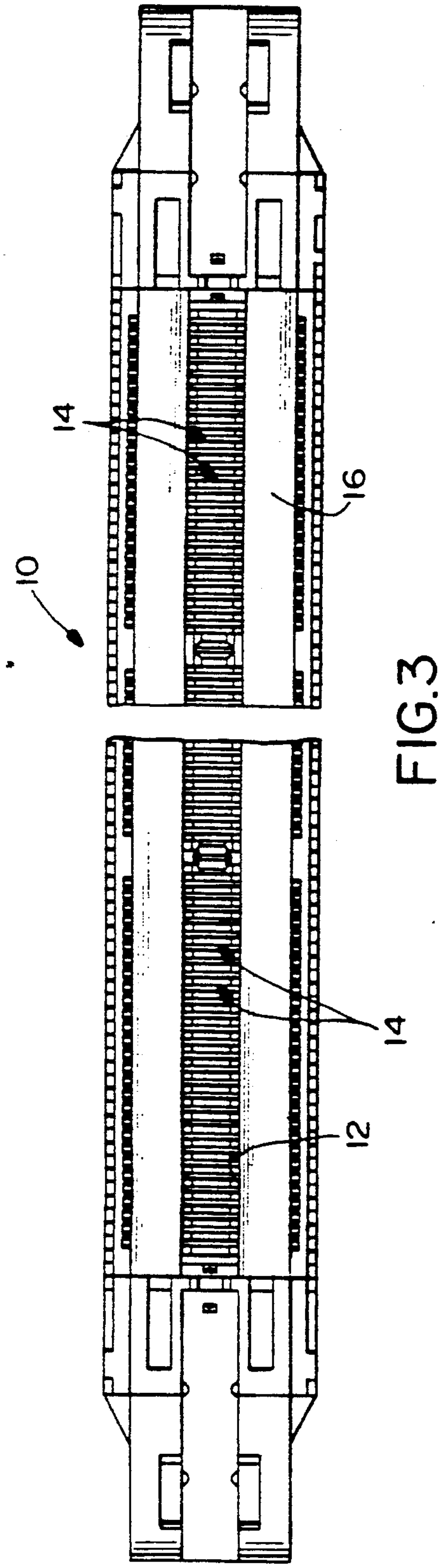
FIG. 3 is a top plan view of the connector.
Figure 2:
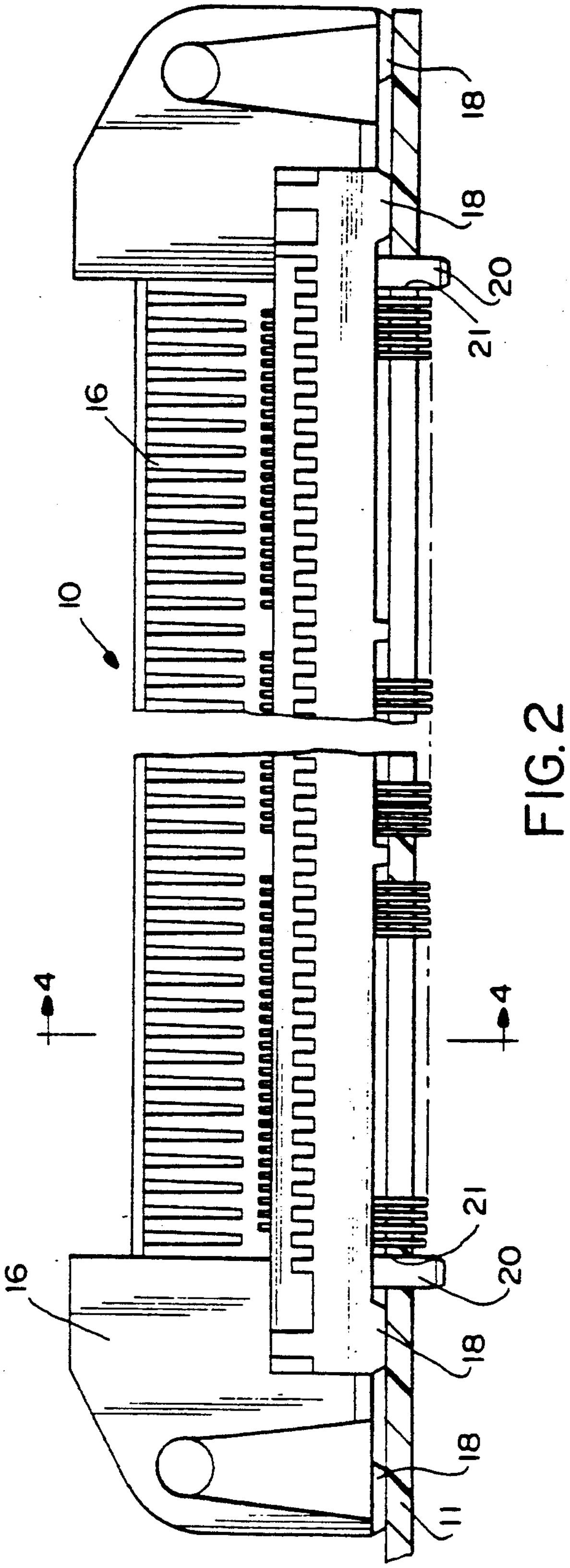
FIG. 2 is a side elevational view of the connector.

Referring to the drawings in greater detail, and first to FIGS. 1–3, the invention is embodied in an edge connector, generally designated for mounting on a printed circuit board 11. Connector 10 is of a type of connector commonly called an "edge card" connector in that it has receptacle means in the form of a slot 12 (FIG. 3) for allowing insertion of a printed circuit card 13 into a contact area of the connector. The inserted printed circuit card has a mating edge 15 and a plurality of contact pads 17*a*, 17*b* adjacent the edge either on one or both sides of the board. Connector 10 is designed with terminals for engaging contact pads on both sides of the printed circuit board adjacent the edge thereof.

Edge connectors such as connector 10 normally are elongated, as shown, and have rows of spring contact element receiving cavities generally designated 22, spaced along one or both sides of slot 12 lengthwise of a dielectric housing 16. As stated above, connector 10 has spring contact elements spaced along slot 12 on both sides thereof for engaging contact pads 17*a*, 17*b* on both sides of an inserted printed circuit card 13. It should be understood that the concepts of the invention are not limited to edge connectors of the character described, and the invention can be embodied in a wide variety of applicable electrical connectors.

With this understanding, dielectric housing 16 includes a plurality of standoffs 18 (FIGS. 1–2) depending from the housing for engaging a surface of printed circuit board 11. Often, the printed circuit board 11 is called a "mother board", and the printed circuit card 13 which is inserted into slot 12 is called a "daughter board". Dielectric housing 16 also includes a plurality of mounting or retention pegs 20 for locating connector 10 on mother board 11 by inserting the pegs into appropriate mounting holes 21 in the board.

Figure 4:
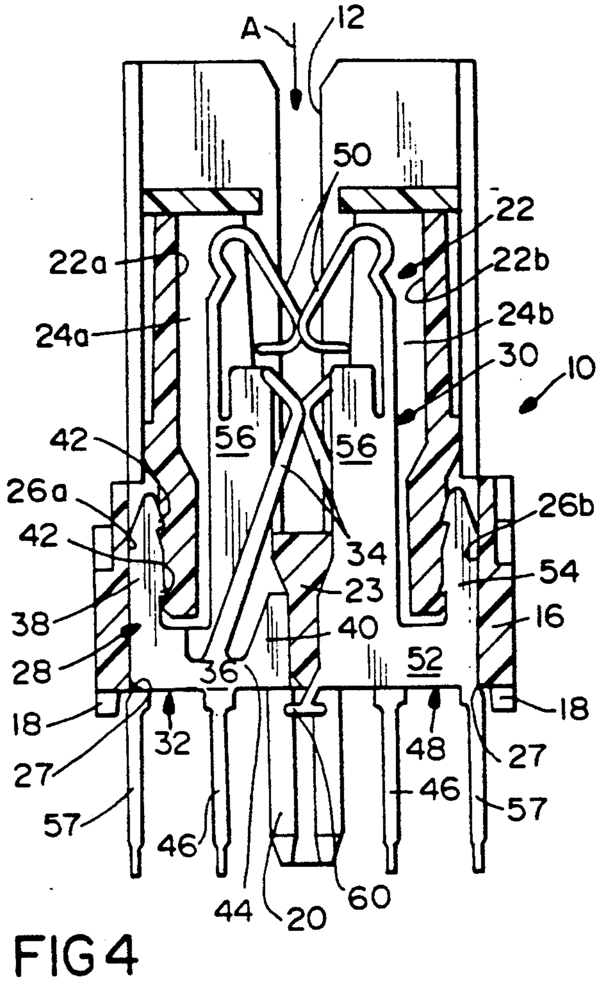
FIG. 4 is a vertical section, on an enlarged scale, taken generally along line 4—4 of FIG. 2.
Figure 5:
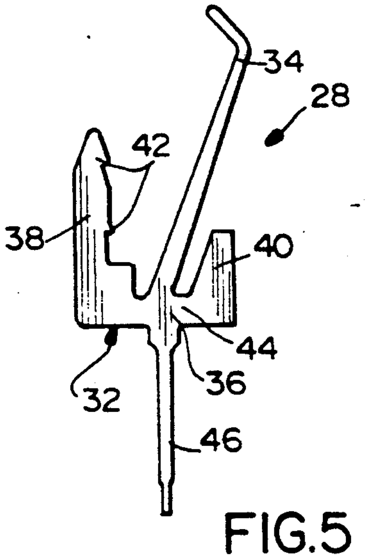
FIG. 5 is an elevational view of one of the signal terminals as seen in FIG. 4.

Referring to FIG. 4, housing 16 includes a plurality of transverse cavities, generally designated 22, spaced longitudinally of slot 12 for receiving alternating differently configured terminals, as described hereinafter. Each cavity 22 has a cavity portion 22*a* on one side of slot 12 (the left-hand side as viewed in FIG. 4) and a cavity portion 22*b* on the opposite side of the slot (the right-hand side as viewed in FIG. 4). Cavities 22 are separated lengthwise of elongated housing 16 by walls or partitions which include wall portions 24*a* separating cavity portions 22*a* and wall portions 24*b* separating cavity portions 22*b*. In addition, cavity portions 22*a* and 22*b* are separated longitudinally of housing 16 by a center partition 23 at the bottom of cavity 22.

Lastly, housing 16 includes a plurality of recesses or holes 26*a* and 26*b* outside of cavity portions 22*a* and 22*b*, respectively, and generally in transverse alignment, for purposes described below. Each recess or hole 26*a*, 26*b* has a mouth 27 opening at the bottom of housing 16. The entire housing is unitarily molded of dielectric material such as plastic or the like.

Generally, a plurality of terminals are mounted on housing 16, spaced longitudinally of the housing and corresponding to the plurality of transversely aligned cavity portions 22*a*, 22*b* and holes 26*a*, 26*b*. Before describing the terminals in detail, it should be understood that the printed circuit board (i.e. the daughter board) which is inserted into slot 12 often has a plurality of contact pads defining two rows of pads along the edge of the board on each side of the board, i.e., the mating edge which is inserted into the slot. One row of contact pads on each side of the board is located near the absolute edge of the board, and the other row of contact pads on each side of the board is spaced inwardly from the one row. Therefore, conventionally, terminals are located on housing 16 with contact elements alternating lengthwise of the housing for alternatingly engaging the contact pads in the two rows thereof along opposite sides of the mating edge of the printed circuit board.

More particularly, referring to FIGS. 1 and 4–7, terminals, generally designated 28 and 30, are mounted on housing 16 in an alternating array lengthwise of the housing; there being an alternating array of terminals 28 and 30 on each opposite side of slot 12 (i.e., on each opposite side of the daughter board). In other words, terminals 28 alternate between adjacent terminals 30 lengthwise of slot 12 and on both sides of the slot. In addition, as clearly seen in FIG. 4, terminals 28 and 30 alternate transversely of the slot. As shown in FIG. 1, each terminal 28 is aligned with a terminal 30 to create a pair of terminals, these terminals are then reversed with each alternating pair.

Terminals 28 are signal terminals and are adapted for engaging contact pads 17a of signal circuit traces on the daughter board as well as signal terminal traces on mother board 11. As shown in FIG. 1, contact pads 17a connected to the signal traces are adjacent edge 15 of edge card 13. Specifically, referring to FIGS. 4 in conjunction with FIG. 5, each signal terminal 28 includes a body portion, generally designated 32, and a spring contact portion 34. Body portion 32 includes a base portion 36, a locking leg section 38 projecting upwardly from the base portion on the outside (relative to the card slot 12) of contact portion 34, and a mechanically non-functional section 40 projecting upwardly from the base portion on the inside (relative to the card slot) of contact portion 34. Locking leg section 38 is provided with barbs 42 whereby the locking leg can be press fit into a respective hole 26a for mounting terminal 28 on housing 16 by inserting locking leg 38 through mouth 27 of the respective hole 26a. Mechanically non-functional section 40 is provided in the form of a stub (as shown) connected to base portion 36 at a narrow area 44. A solder tail 46 projects downwardly from base portion 36 for insertion into a hole in mother board 11 and for electrical soldered interconnection with a signal trace either on the board or in a hole in the board. Such solder tail and mother board could be modified to permit surface mounting as is known in the industry.

The invention contemplates a method and a structure for tuning the impedance of electrical connector 10 which is interconnected in an electrical circuit having a given predetermined impedance. With connector 10 being an edge connector, the electrical circuit would be defined by the circuitry on the mother and daughter printed circuit boards. As generally stated in the "Background" above, an ideal connector would be "transparent" so as to have as little affect on the circuit as possible. Therefore, the invention is directed to concepts for "tuning" or initially modifying the impedance of electrical connector 10 to match the given impedance of the interconnection system or the electrical circuit in which the connector is interconnected.

The given impedance often is called the "characteristic" impedance of a circuit and usually is known. For instance, a manufacturer of electrical connectors often is provided by a customer with a characteristic impedance value of the circuit within which the customer is going to interconnect the particular connector. The customer typically desires a connector that will match the impedance of the circuit in order to minimize its affect on the circuit.

Even if this situation is not present, the impedance of any circuit can be measured by various means, such as a time domain reflectometer which utilizes an electric analog to a radar system, as well as other measuring or analyzing devices. The impedance of any particular connector similarly can be measured in an input-output manner, again by using such instruments as the time domain reflectometer. If the impedance of the connector does not match the impedance of the interconnecting circuit, the present invention contemplates a method and structure for tuning or modifying the impedance of the connector during or prior to assembly thereof in order to substantially match the impedance of the circuit as closely as possible.

Specifically, reference is made again to FIGS. 4 and 5 and the mechanically non-functional sections or stubs 40 of signal terminals 28. Upon determining the desired characteristic impedance of the connector during the design phase of manufacturing the connector, a desired surface area for the stubs 40 can be calculated. Upon building prototypes to these dimensions, the exact desired area can then be determined by testing. The dies utilized for manufacturing the terminals 28 can be modified so as to trim or cut stubs 40 to the desired dimension. In fact, if desired, the entire stub 40 can be severed from terminal 28 by cutting the stub off at narrow area 44. In this manner, the entire area of signal terminals 28 can be varied by trimming stubs 40 whereupon the capacitance is varied. By varying the capacitance, the connector can be "tuned" to the given impedance of the electrical circuit, as determined above. The dimension of such stubs 40 is thus set during the stamping process. The terminals 28, and likewise terminals 30, are inserted into housing 16 from the bottom in a manner known as "bottom-loading."

Figure 6:
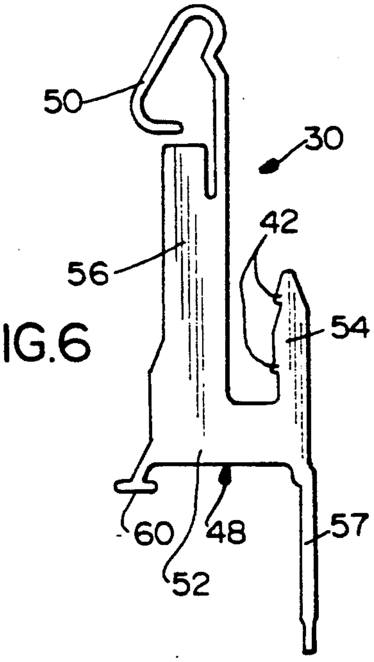
FIG. 6 is an elevational view of one of the ground terminals as seen in FIG. 4.
Figure 7:
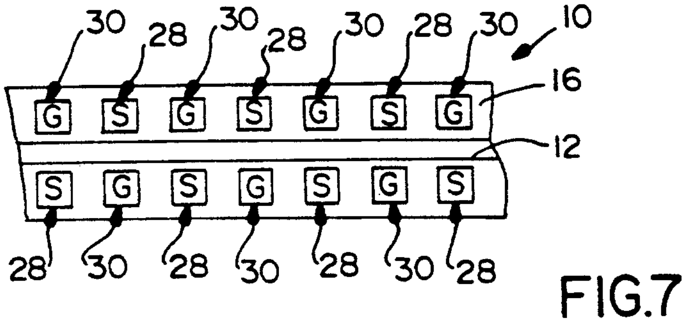
FIG. 7 is a somewhat schematic illustration of the mounting array of signal and ground terminals as seen in FIG. 4.

Referring to FIG. 6 in conjunction with FIG. 4, terminals 30 are ground terminals and are adapted for interconnection between ground circuit traces on the mother and daughter printed circuit boards. Each ground terminal 30 includes a body portion, generally designated 48, and a spring contact portion 50. Body portion 48 includes a base portion 52 having a locking leg 54 with barbs 42 for insertion upwardly through mouth 27 into hole 26b to mount the respective ground terminal on housing 16. Each ground terminal also includes an enlarged surface area portion 56 projecting upwardly from base portion 52 and terminating in spring contact portion 50. A solder tail 57 projects downwardly from base portion 52 for insertion into a hole in mother board and for electrical soldered interconnection with a ground trace either on the board or in a hole in the board.

The invention contemplates that ground terminals 30 have significantly larger transverse areas than signal terminals 28. This can be seen by comparing the ground terminals in FIGS. 4 and 6 with the signal terminals in FIGS. 4 and 5. The significantly larger areas of the ground terminals are afforded by the enlarged surface area portions 56 of the ground terminals.

In essence, by combining the enlarged ground terminals with the alternating array of the signal terminals and ground terminals as described above in relation to FIGS. 4 and 7, the ground terminals effectively "shadow" the signal terminals and thereby provide increased electrical isolation, significantly reducing the crosstalk of connector 10 in a very simple and efficient manner.

The invention also contemplates a structure for reducing the inductance of electrical connector 10, with the connector mounted to a mother board 11 wherein individual ground traces on the board all are part of a common ground circuit, as is found in many edge connectors. Therefore, it would be desirable to reduce the inductance through ground terminals 30 to the common ground circuit.

More particularly, referring again to FIG. 4, it can be seen that each ground terminal 30 has a foot 60 for surface engaging a ground circuit trace on mother board 11. This additional foot and solder tail 57, are provided for engaging a common ground circuit on mother board 11. It should be noted that, although foot 60 is illustrated for surface mounting to the mother board, the foot could be a second solder tail for insertion into another hole in the printed circuit board. Similarly, solder tails 46 and 57 for signal terminals 28 and ground terminals 30, respectively, both could be feet for surface mounting to circuit traces on the printed circuit board.

By providing two points of contact supplied by foot 60 and solder tail 57, a larger contact surface area is provided for engaging the common ground circuit on the printed circuit board. The larger contact surface area reduces the voltage drop and reduces the inductance between a respective ground terminal and the common ground circuit on the printed circuit board. This structure improves the effectiveness of the ground terminals which is particularly important in achieving increased bandwidth and reducing ground bounce in high speed connectors. By spacing the points of contact apart from each other, an area of the board, between the points of contact, is left open to facilitate routing various other circuit traces on the board.

Finally, it can be seen in FIG. 4 that spring contact portions 34 of signal terminals 28 are located "deeper" within slot 12 than spring contact portions 50 of ground terminals 30. These differential locations enable the alternating terminals to engage two rows of contact pads on the daughter board, as described above. It can be seen that spring contact portions 34 and 50 extend transversely into slot 12. When the daughter printed circuit board 13 is inserted into the slot in the direction of arrow "A", the spring contact portions will be biased transversely outwardly while in engagement with the contact pads in two rows along the mating edge of the printed circuit board, the signal contact pads 17*a* being located nearer the absolute edge of the board than the ground contact pads 17*b*.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A method of manufacturing an edge card connector comprising the steps of:

providing an elongated dielectric housing having a card slot therein and a plurality of terminal receiving cavities adjacent said slot;

determining a desired impedance for each of a plurality of terminals;

determining a desired surface area for each of said plurality of terminals;

stamping said plurality of terminals from sheet metal material, each terminal having a body portion with a contact portion extending therefrom for contacting a pad of an edge card inserted into said slot, a mounting portion for securing each said terminal to said housing, a tail portion for securing each said terminal to circuitry on a mother board, and a mechanically non-functional impedance tuning portion;

trimming said mechanically non-functional impedance tuning portion to a given size and, therefore, a given area during a stamping operation of said terminal so that the surface area of each said terminal is substantially equal to said desired surface area; and inserting said terminals into said housing.

2. The method of claim 1 wherein said stamping step includes stamping the mechanically non-functional impedance tuning portion in the form of a stub that extends in a cantilevered manner from said body portion.

3. A method of tuning the impedance of an electrical connector adapted for interconnection in an electrical circuit having a given impedance, the connector including a dielectric housing for mounting a plurality of terminals, the housing having receptacle means for receiving a complementary electrical component which is at least part of an electrical circuit having a given impedance, and a plurality of terminals mounted on the housing and including body portions located in the housing and contact portions for engaging respective terminal means on the electrical component, comprising the steps of:

providing said body portions of the terminals wit mechanically non-functional sections of a given area which affect a given capacitance, said mechanically non-functional sections being stubs that extend in a cantilevered manner from said body portions; and selectively trimming the mechanically non-functional sections to a given size and, therefore, a given area during a stamping operation of said terminals to selectively vary the area thereof and thereby vary the capacitance of the terminals and, therefore, the impedance of the connector to match said given impedance of the electrical circuit.

4. A method of tuning the impedance of an electrical connector adapted for interconnection in an electrical circuit having a given impedance, the connector including a dielectric housing for mounting a plurality of terminals, the housing having receptacle means for receiving a complementary electrical component which is at least part of an electrical circuit having a given impedance, and a plurality of terminals mounted on the housing, each including a body portion located in the housing and having a contact portion extending from said body portion for engaging respective terminal means on the electrical component, a mounting portion integral with said body portion for securing each said terminal to said housing, a tail portion on said body portion for securing each said terminal to circuitry on a mother board, and a mechanically non-functional impedance tuning portion, including the steps of:

providing said housing having terminal receiving cavities therein;

determining the desired physical dimensions of said body portion;

determining the desired physical dimensions of said contact portion;

determining the desired physical dimensions of said mounting portion to retain said terminal within one of said terminal receiving cavities;

determining the desired physical dimensions of said tail portion;

wherein the improvement comprises:

stamping said terminals with mechanically non-functional sections of a given area which effect a given capacitance; and selectively trimming the mechanically non-functional sections, without modifying the physical dimensions of said contact portion, said mounting portion and said tail portion, to selectively vary the area the mechanically non-functional sections and thereby vary the capacitance of the terminals and, therefore, the impedance of the connector to match said given impedance of the electrical circuit.

5. The method of claim 4, wherein said mechanically non-functional sections are stamped to project in a cantilevered manner from said body portions.

* * * * *